（12）United States Patent
Mayfield et al.

(10) Patent No.: US 12,537,343 B2
(45) Date of Patent: Jan. 27, 2026

(54) ELECTRICAL CONNECTOR WITH INTEGRATED ELECTROSTATIC DISCHARGE PROTECTION

(71) Applicant: Rockwell Collins, Inc., Cedar Rapids, IA (US)

(72) Inventors: James B. Mayfield, Cedar Rapids, IA (US); Michael S. Richard, Cedar Rapids, IA (US); David A. Rafson, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 289 days.

(21) Appl. No.: 18/385,567

(22) Filed: Oct. 31, 2023

(65) Prior Publication Data

US 2025/0141157 A1  May 1, 2025

(51) Int. Cl.
*H01R 13/648* (2006.01)

(52) U.S. Cl.
CPC .................. *H01R 13/6485* (2013.01)

(58) Field of Classification Search
CPC .............. H01R 13/6485; H01R 12/716; H01R 13/6588; H01R 2107/00; H05K 3/325; H05K 1/0259; H05K 1/0306; H05K 1/115; H05K 2201/096; H05K 2201/10303; H05K 2201/10356; H05K 2201/10901
See application file for complete search history.

(56) References Cited

U.S. PATENT DOCUMENTS

| | | | |
|---|---|---|---|
| 6,447,316 B1 | 9/2002 | Jon et al. | |
| 7,445,505 B1 | 11/2008 | Yi | |
| 7,726,994 B1 | 6/2010 | Willey | |
| 8,422,195 B2 * | 4/2013 | Stevenson | H05K 1/0219 607/9 |
| 9,461,410 B2 | 10/2016 | Johnescu et al. | |
| 2006/0014433 A1 | 1/2006 | Consoli et al. | |
| 2006/0250731 A1 * | 11/2006 | Parkhurst | H05K 1/0259 361/56 |

(Continued)

FOREIGN PATENT DOCUMENTS

| | | | | |
|---|---|---|---|---|
| JP | 3592710 B2 * | 11/2004 | ......... | H01R 13/6585 |
| KR | 900007299 B1 * | 10/1990 | ............. | H05K 1/184 |

(Continued)

OTHER PUBLICATIONS

European Search Report received in EP Application No. 24209792.1, Mar. 10, 2025, 6 pages.

*Primary Examiner* — Travis S Chambers
(74) *Attorney, Agent, or Firm* — Suiter Swantz IP

(57) ABSTRACT

An electrical connector for high speed and high performance applications requiring protection against electrostatic discharge (ESD). In embodiments, the electrical connector includes a dielectric housing having a plurality of cavities descending from a top surface of the housing, a copper ground plate mounted atop or proximal to the top surface having a plurality of perforations corresponding in number and position to the plurality of cavities, and a plurality of electrical contacts each positioned at depth in one of the cavities such that the electrical contacts are recessed relative to the copper ground plate such that, in use of the electrical connector, a shortest path of ESD is to the copper ground plate and not any of the electrical contacts.

20 Claims, 5 Drawing Sheets

(56) References Cited

U.S. PATENT DOCUMENTS

| | | |
|---|---|---|
| 2009/0180225 A1 | 7/2009 | Pan et al. |
| 2010/0163172 A1* | 7/2010 | Saita ............... H05K 1/185 |
| | | 156/272.6 |
| 2011/0088928 A1* | 4/2011 | Lim ............... H05K 1/0263 |
| | | 174/252 |
| 2015/0134039 A1 | 5/2015 | Marzano et al. |
| 2016/0150639 A1 | 5/2016 | Gailus et al. |
| 2020/0306979 A1* | 10/2020 | Paulson ............... G01K 7/16 |
| 2024/0290927 A1* | 8/2024 | Willem ............... H10D 86/60 |

FOREIGN PATENT DOCUMENTS

| | | | | |
|---|---|---|---|---|
| KR | 20170073323 A | * | 6/2017 | ......... H05K 1/0237 |
| KR | 101842206 B1 | * | 5/2018 | ......... H05K 3/4046 |

* cited by examiner

ELECTRICAL CONNECTOR WITH INTEGRATED ELECTROSTATIC DISCHARGE PROTECTION

TECHNICAL FIELD AND BACKGROUND

The present disclosure relates generally to high performance electrical connectors, and more particularly, to an electrical connector for supporting high frequency digital signals having an integrated surface mounted ground plate for providing a direct arc path for protection against electrostatic discharge (ESD) during repeated detachable connections.

Certain types of high performance electrical connectors require strict protections against electromagnetic interference (EMI) and electrostatic discharge (ESD) to perform optimally, and particularly those connector types operable for interconnecting a large number of signal transmission lines to printed circuit boards (PCBs).

One specific type of connector requiring strict electrical protections can be found in current digital night vision helmet mounted displays (HMDs). Such connectors have very stringent requirements for high performance while meeting additional requirements for low weight, low power, small form factor, high resolution and frame rate, and detachability for vision sensors. In such connectors, it can be difficult to meet connector packaging and signal integrity requirements while also meeting the requirements for ESD protection when using ESD diodes.

Therefore, what is needed is a solution for ESD protection without the need for complicated connector assemblies and ESD diodes that have a detrimental impact on signal integrity, performance in an EMI environment, reliability, power, weight, and size.

BRIEF SUMMARY

Broadly, the present disclosure provides a specialized PCB-based electrical connector solution for preventing ESD from impacting signal transmissions. In embodiments, the electrical connector includes cavities formed in the connector housing for positioning the electrical contacts at depth relative to a ground positioned at the surface of the connector. In use, the surface ground provides the shortest path for an ESD arc thereby protecting the pin connection points from ESD and obviating the need for ESD diodes in the connector assembly.

In one aspect, the present disclosure provides an electrical connector including a dielectric housing having a top surface, a bottom surface, and a plurality of cavities descending perpendicularly from the top surface in a direction of the bottom surface. In embodiments, each cavity is dimensioned to receive a connecting pin of a mating connector. A copper ground plate, mounted on the top surface of the dielectric housing, includes a plurality of perforations corresponding in number and position to the plurality of cavities, with each perforation positioned in surrounding relation to one of the plurality of cavities. A plurality of electrical contacts for the connection pins are each positioned at a bottom of one of the plurality of cavities and extend through the dielectric housing in a direction of the bottom surface for connection to a circuit board, with each electrical contact recessed relative to the copper ground plate such that, in use of the electrical connector, a shortest path of electrostatic discharge (ESD) is to the copper ground plate and not any of the plurality of electrical contacts.

In at least some embodiments, each cavity has a circular cross-section having a diameter between 0.01 in and 0.1 in, wherein such dimensions are application specific and specific to the utilized signals. Spacing may depend, for example, on the desired impedance of the signals, diameter of the connection pins, properties of the specific PCBs/mating connector materials, etc.

In at least some embodiments, each cavity has depth between 25% and 60% of the thickness of the dielectric housing.

In at least some embodiments, a distance between an electrical contact and its closest part of the copper ground plate is at least 0.01 in.

In at least some embodiments, each cavity has a circular cross-section and each perforation is circular. Other cavity shapes include, but are not limited to, oval and pill shaped to accommodate differential signals in certain applications.

In at least some embodiments, the copper ground plate is a singular structure, and wherein the copper ground plate is electrically coupled through the dielectric housing for connection to a circuit board ground.

In at least some embodiments, each electrical contact is positioned in a first plane, the copper ground plate is positioned in a second plane, and the first plane is parallel to the second plane.

In at least some embodiments, each side of the dielectric housing is oriented perpendicular to each of the top surface and the bottom surface.

In at least some embodiments, the plurality of cavities are arranged in a pattern including a plurality of rows and a plurality of columns.

In at least some embodiments, each cavity is spaced apart from each adjacent cavity by a distance between about 0.015 in and about 0.150 in, specific to the impedance of the required signal and other design parameters.

In at least some embodiments, the plurality of cavities are each equally sized and shaped, and the plurality of perforations are each equally sized and shaped.

In at least some embodiments, the dielectric housing comprises at least one of plastic, ceramic and glass.

In at least some embodiments, the electrical connector is configured to detachably connect to a connector of a night vision sensor of a helmet mounted night vision display assembly.

In at least some embodiments, the electrical connector is devoid of electrostatic discharge diodes.

In another aspect, the present disclosure provides an electrical connector configured to detachably connect to a night vision sensor mating connector of a flight helmet. In embodiments, the electrical connector includes a dielectric housing having a top surface, a bottom surface, a plurality of sides oriented perpendicular to each of the top surface and the bottom surface, and a plurality of cavities descending perpendicularly from the top surface in a direction of the bottom surface. The electrical connector further includes a copper ground plate mounted on the top surface of the dielectric housing, the copper ground plate having a plurality of perforations corresponding in number and position with a number and position of the plurality of cavities, each perforation positioned in surrounding relation to one of the plurality of cavities. The electrical connector further includes a plurality of electrical contacts, each electrical contact positioned at a bottom of one of the plurality of cavities and extending through the dielectric housing in a direction of the bottom surface, each electrical contact recessed relative to the copper ground plate such that, in use of the electrical connector, a shortest path of ESD from the connector of the night vision sensor is to the copper ground plate and not any of the plurality of electrical contacts.

This summary is provided solely as an introduction to subject matter that is fully described in the following detailed description and drawing figures. This summary should not be considered to describe essential features nor be used to determine the scope of the claims. Moreover, it is to be understood that both the foregoing summary and the following detailed description are explanatory only and are not necessarily restrictive of the subject matter claimed.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
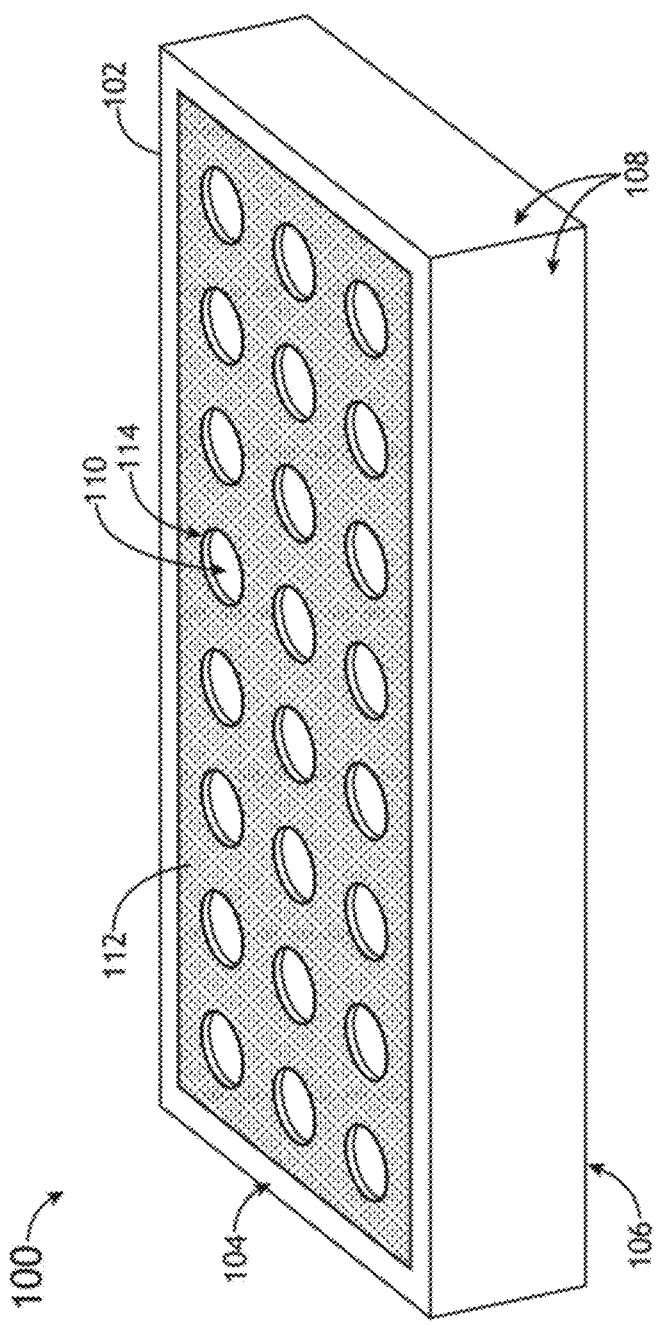
FIG. 1 is a perspective view of an electrical connector including ESD protection, in accordance with example embodiments of this disclosure.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein, a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to electrical connectors suitable for use in performing repeatable detachable connections. In embodiments, the electrical connector provides electrical attachment but not necessarily mechanical attachment for a mating connector, thereby facilitating quick release. In embodiments, the electrical connector includes a surface-mounted copper ground plate and internal plated pads for performing electrical connections, wherein a shorter ESD arc path is provided to the copper ground plate as compared to the plated pads positioned at depth in the connector housing. In embodiments, the electrical connection supports many high speed data lanes, for instance as required in a night vision sensor application.

Some advantages of the electrical connector according to the present disclosure include, but are not limited to, signal integrity, small form factor, low weight, reduced complexity, durability, customized design flexibility, and elimination of ESD diodes.

FIG. 1 illustrates an electrical connector 100 configured to mate with a compatible electrical connector including a plurality of protruding signal pins (not shown). The electrical connector 100 includes a dielectric housing 102 having a top surface 104, a bottom surface 106, and opposing sides 108. The terms 'top' and 'bottom' as used herein is used to denote the facing orientations of the electrical connector 100, wherein the top surface 104 in use faces the mating electrical connector and the bottom surface 106 in use is configured for mounting to a structure, for instance a printed circuit board (PCB). The dielectric housing 102 may be constructed from various dielectric materials including, but not limited to, plastics, ceramics, glass, and combinations thereof.

The thickness of the dielectric housing 102 extends between the top and bottom surfaces 104, 106, whereas the length and width dimensions extend between the pairs of opposing sides. The dielectric housing may have any shape customizable to any application. In embodiments, each of the sides 108 is oriented perpendicular or substantially perpendicular to each of the top surface 104 and the bottom surface 106 to facilitate a free mechanical connection with the mating electrical connector.

The dielectric housing 102 includes a plurality of cavities 110 each of which descends or extends from the top surface 104 in a direction of the bottom surface 106. Each cavity 110 may have any shape such as the cylindrical shape shown for receiving a cylinder shaped signal pin. In embodiments in which the cavities are cylinder shaped, each cavity may have a circular cross-section having a diameter between, for example, about 0.01 in and 0.10 in. The shape of each cavity may correspond to the shape of the signal pin to be received therein, for instance oval or pill shaped.

The plurality of cavities 110 may be arranged to form any predefined pattern. As shown, the cavity pattern includes a plurality of rows and a plurality of columns having equidistant spacing between each of the cavities 110. The pattern may be customized, based on the application, to include any number of cavities, cavity shape(s), cavity spacing, and predefined pattern. Each cavity 110 is shown spaced inward from a lateral side 108 of the dielectric housing 102.

The electrical connector 100 further includes a copper ground plate 112 mounted on the top surface 104 of the dielectric housing 102. In embodiments, portions of the copper ground plate 112 may be positioned beneath dielectric housing material whereas other portions of the copper ground plate 112 (e.g., edge portions) are left exposed. In embodiments, the copper ground plate 112 may be a singular structure having a plurality of perforations 114 formed through the thickness of the plate. In embodiments, the plurality of perforations 114 may correspond in number shape to the plurality of plurality of cavities 110 formed in the dielectric housing 102. Each perforation 114 may be positioned in surrounding relation to one of the cavity openings such that continuous copper surrounds each cavity opening. In embodiments in which the perforations are substantially circular as shown, the diameter of the perforations may be equal to or substantially equal to the diameter of the cavity opening. In some embodiments, the copper may be recessed slightly from the edge of the respective cavity opening.

Figure 2:
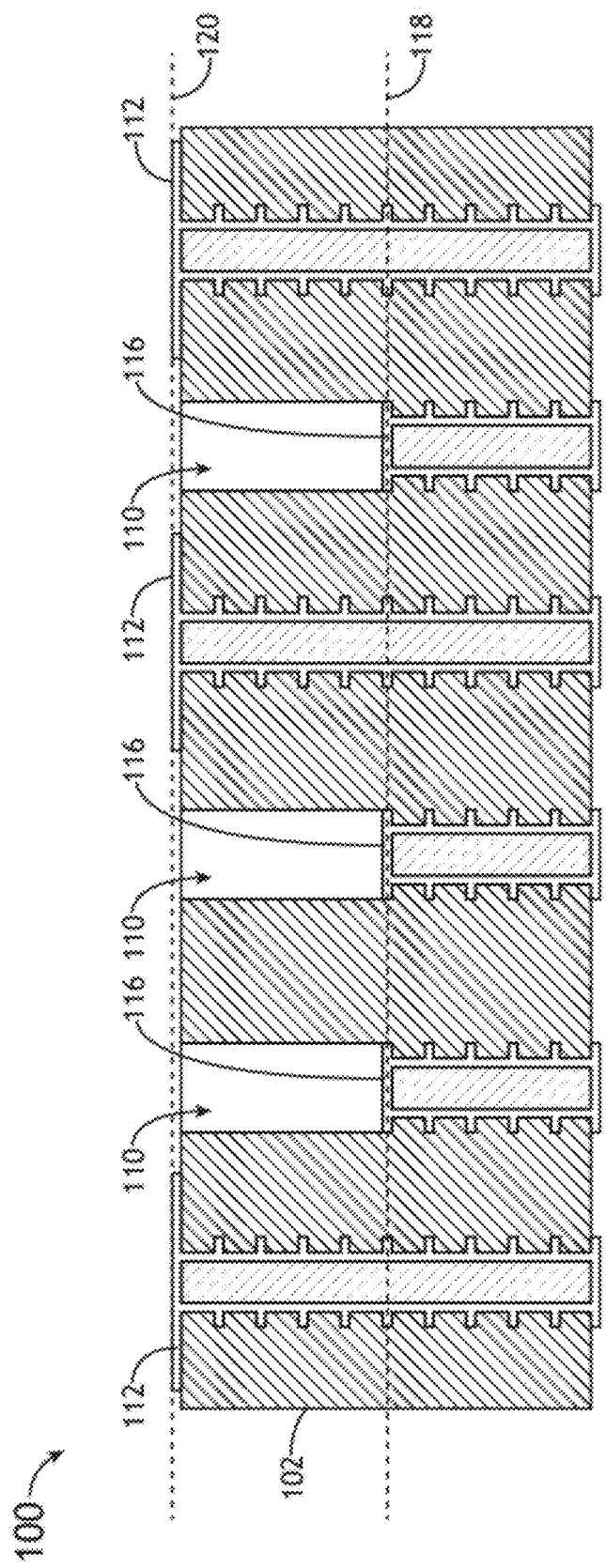
FIG. 2 is a lateral cross-sectional view of the electrical connector shown in FIG. 1, in accordance with example embodiments of this disclosure.

FIG. 2 is a lateral cross-section of the electrical connector 100 illustrating the positional relationship of the copper ground plate 112 relative to the internal electrical contacts. A plurality of plated pads 116 forming electrical contacts for the connection pins are positioned at depth within the dielectric housing 102. In embodiments, a plated pad 116 is positioned at the bottom of each cavity 110 configured to receive a signal pin. Each plated pad 116 is electrically coupled to conductive material that extends through the dielectric housing 102 for connection to, for example, the PCB. In addition, each plated pad 116 is spaced apart from a nearest part of the copper ground plate 112 such that no conductive connection is provided between the copper ground plate 112 and the plated pads 116. Each cavity 110 may have a depth, measured from the top surface 104 to the bottom of the cavity 110, between about 25% and about 60% of the thickness of the dielectric housing 102. In embodiments, as shown, the cavity walls are not electroplated such that no conductive connection is provided between the copper ground plate 112 and the respective plated pad 116. In some embodiments, part of the cavity walls proximal to the plated pads 116 may be electroplated whereas part of the same cavity wall proximal to the connector surface may not be electroplated.

As shown, each cavity 110 may have a consistent depth, shape, cross-section, and lateral spacing such that the plurality of plated pads 116 form a pattern in which the plated pads 116 reside in a first plane 118, the copper ground plate 112 resides in a second plane 120, and the first and second planes 118, 120 are parallel or substantially parallel. The opening of each cavity 110 and the distance from each plated pad 116 to its respective nearest part of the copper ground plate 112 (e.g., adjacent the top opening to cavity) is such that, in the event of ESD, a shortest arc path is to the copper ground plate 112 and not any of the plated pads 116 positioned at depth in the dielectric housing 112. In other words, the ground copper plate 112 is positioned substantially at or on the top surface 104, the cavity openings are dimensioned small enough, and the depth of the plated pads 116 are such that the shortest path for an ESD arc is always to the surface copper. In embodiments, the surface copper may be electrically connected through the thickness of the dielectric housing 102 for grounding on the PCB. In some embodiments, the ground copper plate 112 may be internal or partially covered by dielectric housing material with at least some portions exposed, for example exposed at the edges.

Figure 3:
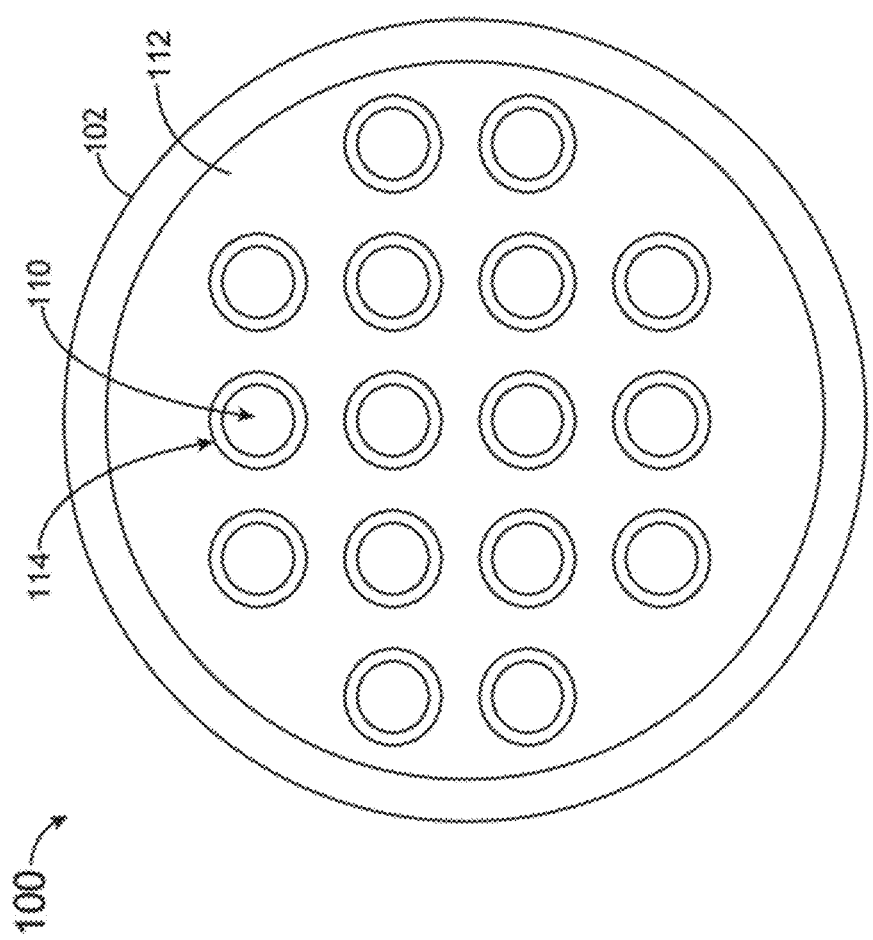
FIG. 3 is a top plan view of another embodiment of an electrical connector, in accordance with example embodiments of this disclosure.

FIG. 3 illustrates a further predefined pattern for the cavities 110 and perforated surface copper 112 including a circular dielectric housing 102 and rows and columns of descending cavities 110. As shown, the surface copper is a singular plate including a plurality of perforations 114 corresponding in number and aligned with the cavities 110. In embodiments, some or all of the cavities 110 may be populated with plated pads depending on the configuration of the mating electrical connector.

Figure 4:
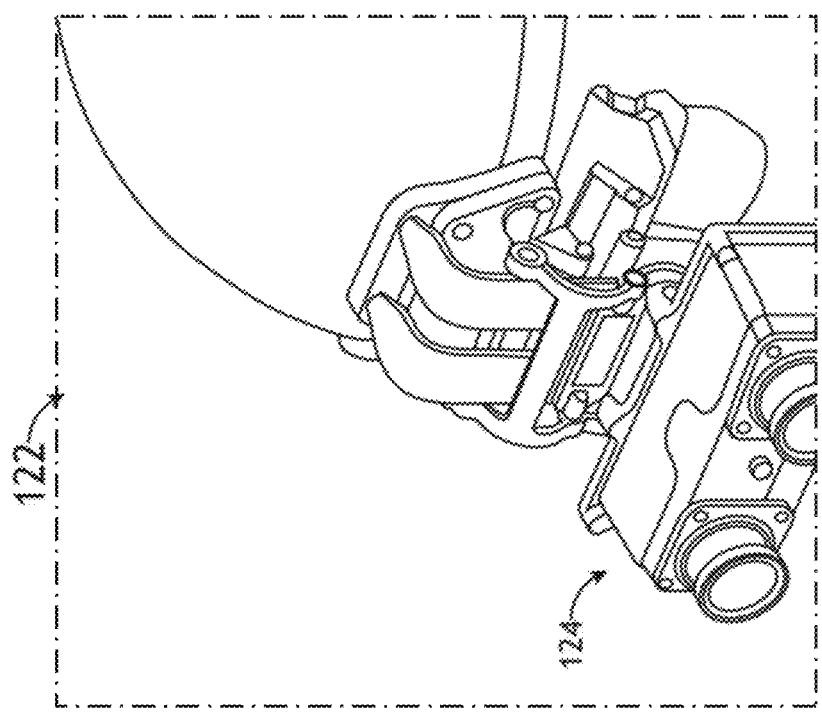
FIG. 4 is a perspective view of a non-limiting example of a detachable night vision helmet mounted display (HMD) assembly.

FIG. 4 illustrates an exemplary application and non-limiting example of a helmet mounted night vision display assembly 122 including a detachable night vision sensor assembly 124.

Figure 5:
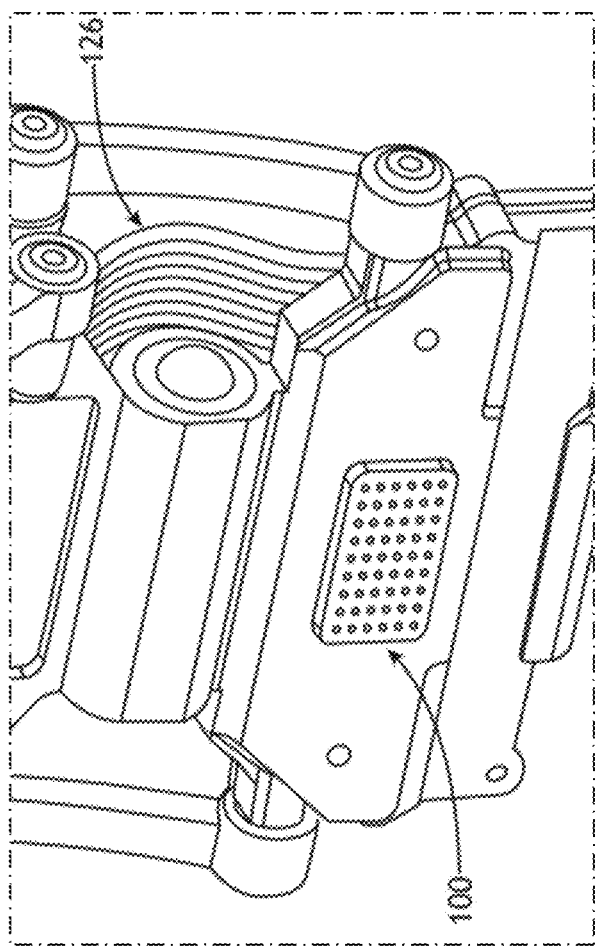
FIG. 5 is a detailed view of a portion of the HMD assembly of FIG. 4 illustrating use of the electrical connector shown in FIG. 1, in accordance with example embodiments of this disclosure.

FIG. 5 illustrates the night vision sensor attachment interface, and particularly the use of the electrical connector 100 according to the present disclosure. As shown, the electrical connector 100 is operable for supporting the electrical connections between the mating connector of the detachable night vision sensor and the many high speed data lanes 126 for the night vision video.

From the above description, it is clear that the inventive concepts disclosed herein are well adapted to achieve the objectives and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. An electrical connector, comprising:
   a dielectric housing having a top surface, a bottom surface, and a plurality of cavities descending perpendicularly from the top surface in a direction of the bottom surface;
   a copper ground plate mounted atop or proximal to the top surface of the dielectric housing, the copper ground plate having a plurality of perforations corresponding in number and position with a number and position of the plurality of cavities, each perforation positioned in surrounding relation to one of the plurality of cavities; and a plurality of electrical contacts, each electrical contact positioned at a bottom of one of the plurality of cavities and extending through the dielectric housing in a direction of the bottom surface for connection to a circuit board, each electrical contact recessed relative to the copper ground plate such that, in use of the electrical connector, a shortest path of electrostatic discharge (ESD) is to the copper ground plate and not any of the plurality of electrical contacts.

2. The electrical connector according to claim 1, wherein no conductive connection is provided between the copper ground plate and the plurality of electrical contacts.

3. The electrical connector according to claim 1, wherein:
each cavity has a substantially circular cross-section having a diameter between about 0.01 inches and about 0.10 inches; and
each cavity has depth between about 25% and about 60% of a thickness of the dielectric housing.

4. The electrical connector according to claim 1, wherein a distance between an electrical contact and its closest part of the copper ground plate is at least 0.01 inches.

5. The electrical connector according to claim 1, wherein each cavity has a circular cross-section and each perforation is circular.

6. The electrical connector according to claim 1, wherein the copper ground plate is a singular structure, and wherein the copper ground plate is electrically coupled through the dielectric housing for connection to a circuit board ground.

7. The electrical connector according to claim 1, wherein each electrical contact is positioned in a first plane, the copper ground plate is positioned in a second plane, and the first plane is parallel to the second plane.

8. The electrical connector according to claim 1, wherein each side of the dielectric housing is oriented perpendicular to each of the top surface and the bottom surface.

9. The electrical connector according to claim 1, wherein the plurality of cavities are arranged in a pattern including a plurality of rows and a plurality of columns.

10. The electrical connector according to claim 1, wherein each cavity is spaced apart from each adjacent cavity by a distance between about 0.015 inches and about 0.150 inches.

11. The electrical connector according to claim 1, wherein the plurality of cavities are equally sized and shaped, and wherein the plurality of perforations are equally sized and shaped.

12. The electrical connector according to claim 1, wherein the dielectric housing comprises at least one of plastic, ceramic, and glass.

13. The electrical connector according to claim 1, utilized in a detachable night vision sensor application.

14. The electrical connector according to claim 1, wherein the electrical connector does not include electrostatic discharge diodes.

15. An electrical connector configured to detachably connect to a connector of a night vision sensor, the electrical connector comprising:
a dielectric housing having a top surface, a bottom surface, a plurality of sides oriented perpendicular to each of the top surface and the bottom surface, and a plurality of cavities descending perpendicularly from the top surface in a direction of the bottom surface;
a copper ground plate mounted atop or proximal to the top surface of the dielectric housing, the copper ground plate having a plurality of perforations corresponding in number and position with a number and position of the plurality of cavities, each perforation positioned in surrounding relation to one of the plurality of cavities; and
a plurality of electrical contacts, each electrical contact positioned at a bottom of one of the plurality of cavities and extending through the dielectric housing in a direction of the bottom surface, each electrical contact recessed relative to the copper ground plate such that, in use of the electrical connector, a shortest path of electrostatic discharge (ESD) from the connector of the night vision sensor is to the copper ground plate and not any of the plurality of electrical contacts.

16. The electrical connector according to claim 15, wherein no conductive connection is provided between the copper ground plate and the plurality of electrical contacts.

17. The electrical connector according to claim 15, wherein:
each cavity has a substantially circular cross-section having a diameter between about 0.01 inches and about 0.10 inches; and
each cavity has depth between about 25% and about 60% of a thickness of the dielectric housing.

18. The electrical connector according to claim 15, wherein the plurality of cavities are arranged in a pattern including a plurality of rows and a plurality of columns.

19. The electrical connector according to claim 15, wherein each cavity is spaced apart from each adjacent cavity by a distance between about 0.015 inches and about 0.150 inches.

20. The electrical connector according to claim 15, wherein the electrical connector does not include electrostatic discharge diodes.

* * * * *